United States Patent
Yamawaku et al.

(10) Patent No.: US 8,409,328 B2
(45) Date of Patent: Apr. 2, 2013

(54) SUBSTRATE TRANSFER DEVICE AND SUBSTRATE TRANSFER METHOD

(75) Inventors: Jun Yamawaku, Nirasaki (JP); Junji Oikawa, Nirasaki (JP); Hiroyuki Nakayama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 484 days.

(21) Appl. No.: 12/726,598

(22) Filed: Mar. 18, 2010

(65) Prior Publication Data

US 2010/0236405 A1 Sep. 23, 2010

Related U.S. Application Data

(60) Provisional application No. 61/228,644, filed on Jul. 27, 2009.

(30) Foreign Application Priority Data

Mar. 19, 2009 (JP) ................................ 2009-068286

(51) Int. Cl.
*B03C 3/016* (2006.01)

(52) U.S. Cl. ............. 95/58; 95/78; 96/16; 96/30; 96/63; 96/64; 96/77; 118/729; 427/255.5

(58) Field of Classification Search ............... 96/16, 30, 96/31, 63, 64, 66, 77, 95–98; 95/58, 78; 118/728, 729; 427/255.5
See application file for complete search history.

(56) References Cited

U.S. PATENT DOCUMENTS

| | | | | |
|---|---|---|---|---|
| 2,939,006 A | * | 5/1960 | Oswald | 361/230 |
| 3,744,216 A | * | 7/1973 | Halloran | 96/16 |
| 5,060,805 A | * | 10/1991 | Fujii et al. | 209/3 |
| 5,855,653 A | * | 1/1999 | Yamamoto | 96/58 |
| 6,156,088 A | * | 12/2000 | Cardarelli | 55/385.8 |
| 6,159,421 A | * | 12/2000 | Fujii | 422/4 |
| 6,585,809 B1 | * | 7/2003 | Parsa | 96/16 |
| 7,578,883 B1 | * | 8/2009 | Williams et al. | 118/715 |
| 7,833,310 B2 | * | 11/2010 | Kwon et al. | 95/3 |
| 2012/0174773 A1 | * | 7/2012 | Moriya | 95/73 |

FOREIGN PATENT DOCUMENTS

| | | | | |
|---|---|---|---|---|
| JP | 6-154650 A | * | 6/1994 | 96/16 |
| JP | 2002-353086 | | 12/2002 | |

* cited by examiner

*Primary Examiner* — Richard L Chiesa
(74) *Attorney, Agent, or Firm* — Rothwell, Figg, Erst & Manbeck, P.C.

(57) ABSTRACT

A substrate transfer device includes an atmosphere introduction unit and an atmosphere exhaust unit provided at a top and a bottom portion of a main body of the device, respectively; and a substrate transfer mechanism provided between the atmosphere introduction unit and the atmosphere exhaust unit. The substrate transfer device further includes a downward flow forming unit provided, adjacent to the atmosphere introduction unit, to allow an atmosphere to be introduced through the atmosphere introduction unit and to downwardly flow through the substrate transfer mechanism and be exhausted through the atmosphere exhaust unit; and a gas ionizing unit for ionizing the atmosphere and a particle collecting unit for collecting particles included in the atmosphere, the gas ionizing unit and the particle collecting unit being sequentially provided in the direction in which the atmosphere downwardly flows, between the downward flow forming unit and the substrate transfer mechanism.

18 Claims, 6 Drawing Sheets

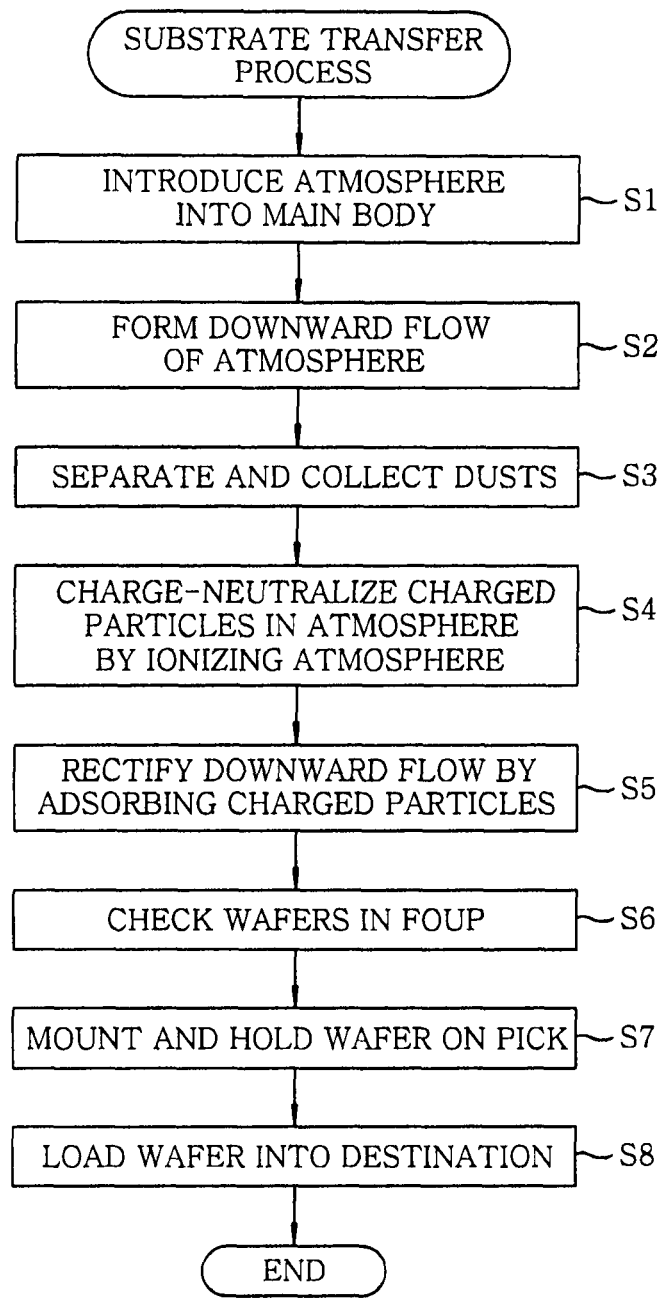

US 8,409,328 B2

SUBSTRATE TRANSFER DEVICE AND SUBSTRATE TRANSFER METHOD

CROSS-REFERENCE TO RELATED APPLICATIONS

This application claims priority to Japanese Patent Application No. 2009-068286 filed on Mar. 19, 2009, the entire contents of which are incorporated herein by reference.

FIELD OF THE INVENTION

The present invention relates to a substrate transfer device and a substrate transfer method; and, more particularly, to a substrate transfer device and a substrate transfer method, which transfer a substrate in an atmospheric pressure state.

BACKGROUND OF THE INVENTION

Recently, the scaling-down of a semiconductor device has been in progress. To that end, it is needed to form a finer circuit pattern on a surface of a substrate for a semiconductor device. As the circuit pattern is formed more finely on the surface of a processing target substrate, it becomes necessary to manage and control as foreign substances particles having small diameters of several tens of nanometers (e.g., 30 nm to 100 nm), which have conventionally been treated as being nonproblematic, because such small-sized particles tend to cause an open circuit or damage on device characteristics in a semiconductor device, for example.

As the diameters of the particles as foreign substances get smaller, an adsorption strength by which such small-sized particles are adsorbed onto a member, e.g., a processing target substrate, may be dominantly affected by an electrostatic force. Accordingly, it becomes important to prevent the charged particles from being attached on a member, e.g., a processing target substrate, in a substrate processing apparatus employing an electrostatic chuck which attracts and holds the processing target substrate to perform the plasma-etching on the processing target substrate.

FIG. 6 is a graph showing relationships between a size (diameter) of a particle and an adsorption strength thereof. In FIG. 6, the vertical axis indicates an adsorption strength (deposition velocity) (cm/s), and the horizontal axis indicates the size of the particle. It can be seen that, as the diameter of the particle gets smaller, especially, equal to or smaller than about 100 nm, the adsorption strength is dominantly affected by the electrostatic force as described above. Accordingly, to prevent the particles from being attached on the processing target substrate or the like, it is essential to maintain the particles not to be charged or such static electricity not to be accumulated in the substrate processing apparatus.

As described above, the static electricity may cause the particles to be adsorbed onto the processing target substrate or the like and, furthermore, may cause electronic components to be damaged. For example, a semiconductor device may be damaged by the static electricity of about 1000 V. Moreover, when charges in a charged processing target substrate are released to other parts, in a substrate processing apparatus employing an electrostatic chuck for attracting the processing target substrate thereon, the processing target substrate may be damaged or a discharge trace may remain in the processing target substrate. As a result, the production yield may be lowered.

FIG. 7 shows how a substrate processing apparatus is affected by static electricity. As shown in FIG. 7, the substrate processing apparatus includes a process module 71 for performing a predetermined process on a processing target substrate (hereinafter, simply referred to as "wafer"); a loader module 72 serving as a transfer chamber that transfers the wafer; a front-opening unified pod (FOUP) mounted to the loader module 72 and accommodating the wafers; and a load-lock module 74 connecting the loader module 72 to the process module 71. A processing vessel (hereinafter, referred to as "chamber") of the process module 71 is provided with a gas exhaust path 75 and a dry pump 76 which serves to exhaust a gas from the vessel.

In such a substrate processing apparatus, the following problems may be caused by static electricity accumulated therein. That is, by the static electricity accumulated in the FOUP 73, floating particles therein are charged, thereby being adsorbed onto a wafer W. Furthermore, by the static electricity, a discharge may be generated between the FOUP 73 and a wafer accommodated in the FOUP 83, thereby causing a discharge trace to remain on the wafer W. The inside of the load-lock module 74 is repeatedly pressurized to an atmospheric pressure state and depressurized to a vacuum state. For that reason, static electricity may be easily accumulated in the load-lock module 74. The accumulated static electricity may cause the particles to be adsorbed onto the wafer or the like.

Moreover, when a wafer W is exposed to a plasma or the wafer W is attached on or detached from the electrostatic chuck in the process module 71, the wafer W may be charged, thereby causing particles to be adsorbed thereonto. Further, while the gas inside the chamber of the process module 71 is exhausted through the gas exhaust path 75, reaction products produced by a chemical etching reaction or the like of a processing gas and unreacted residual substances may be charged by static electricity generated by friction with an inner wall surface of the gas exhaust path 75. As a result, the reaction products and the unreacted residual substances may be attached and deposited on the inner wall surface of the gas exhaust path 75. As such deposits are gradually increased, the gas exhaust path 75 may be eventually blocked.

In addition, due to static electricity accumulated in the loader module 72 serving as a substrate transfer device, the particles therein are charged, thereby causing a particle contamination problem that the charged particles are attached onto the wafer W.

For example, Japanese Patent Application Publication No. 2002-353086 (JP 2002-353086 A) discloses a technique to prevent in advance the occurrence of the problems caused by static electricity generated in various components of such a substrate processing apparatus.

In JP 2002-353086 A, a charge-neutralizing device is provided in an air lock chamber serving as a passage through which a processing target substrate, e.g., a wafer, is transferred between a processing chamber and the outside. The charge-neutralizing device generates an ion flow inside the air lock chamber to charge-neutralize ionic particles (remove static electricity). Then, a gas inside the air lock chamber is vacuum-evacuated, thereby exhausting and removing the particles from the air lock chamber.

Moreover, JP 2002-353086 A also discloses that, after the particles attached onto the inner wall of the air lock chamber are exhausted and removed from the air lock chamber, the wafer is loaded into the air lock chamber. Then, the charged particles attached onto the wafer can be electrostatically adsorbed onto an electrode provided above the wafer by applying to the electrode a voltage, which is determined by considering the charged state of the wafer.

However, in the above-described conventional technique, there is no mention of preventing the particle contamination of a wafer caused by the charged particles in a substrate transfer device (hereinafter, referred to as "loader module") which transfers the wafer in the atmosphere.

Fine particles included in the atmosphere that is introduced into a main body of the substrate transfer device (loader module) and passes through a downward flow forming unit, e.g., a fan filter unit (FFU), is dominantly affected by an electrostatic force. If such fine particles are charged, they may be attached onto a wafer or the like, thereby causing the particle contamination. Accordingly, it is needed to find an effective method to prevent the particle contamination caused by such fine particles in the substrate transfer device, especially, that have passed through the FFU).

SUMMARY OF THE INVENTION

In view of the above, the present invention provides a substrate transfer device and a substrate transfer method, capable of preventing a particle contamination of a substrate caused by the attachment of particles onto a transfer target substrate, the particles being included in an atmosphere that downwardly flows in a substrate transfer device.

In accordance with an aspect of the present invention, there is provided a substrate transfer device including an atmosphere introduction unit and an atmosphere exhaust unit provided at a top and a bottom portion of a main body of the device, respectively; a substrate transfer mechanism provided between the atmosphere introduction unit and the atmosphere exhaust unit; a downward flow forming unit provided, adjacent to the atmosphere introduction unit, to allow an atmosphere to be introduced through the atmosphere introduction unit and to downwardly flow through the substrate transfer mechanism and be exhausted through the atmosphere exhaust unit; and a gas ionizing unit for ionizing the atmosphere and a particle collecting unit for collecting particles included in the atmosphere, the gas ionizing unit and the particle collecting unit being sequentially provided in the direction in which the atmosphere downwardly flows, between the downward flow forming unit and the substrate transfer mechanism.

In accordance with another aspect of the present invention, there is provided a substrate transfer method for transferring a substrate in a substrate transfer device including an atmosphere introduction unit and an atmosphere exhaust unit provided at a top and a bottom portion of a main body of the device, respectively; a substrate transfer mechanism provided between the atmosphere introduction unit and the atmosphere exhaust unit; and a downward flow forming unit provided adjacent to the atmosphere introduction unit. The method includes allowing an atmosphere to be introduced through the atmosphere introduction unit and to downwardly flow through the substrate transfer mechanism and be exhausted through the atmosphere exhaust unit, by using the downward flow forming unit; and charge-neutralizing charged particles included in the atmosphere by ionizing the atmosphere by a gas ionizing unit provided between the downward flow forming unit and the substrate transfer mechanism and collecting charged particles that remain in the atmosphere by a particle collecting unit provided downstream of and adjacent to the gas ionizing unit.

BRIEF DESCRIPTION OF THE DRAWINGS

The objects and features of the present invention will become apparent from the following description of embodiments, given in conjunction with the accompanying drawings, in which:

FIG. 5 is a flow chart showing a substrate transfer process of a substrate transfer method in accordance with the embodiment of the present invention;

DETAILED DESCRIPTION OF THE EMBODIMENTS

An embodiment of the present invention will now be described in detail with reference to the accompanying drawings which form a part hereof.

Figure 1:
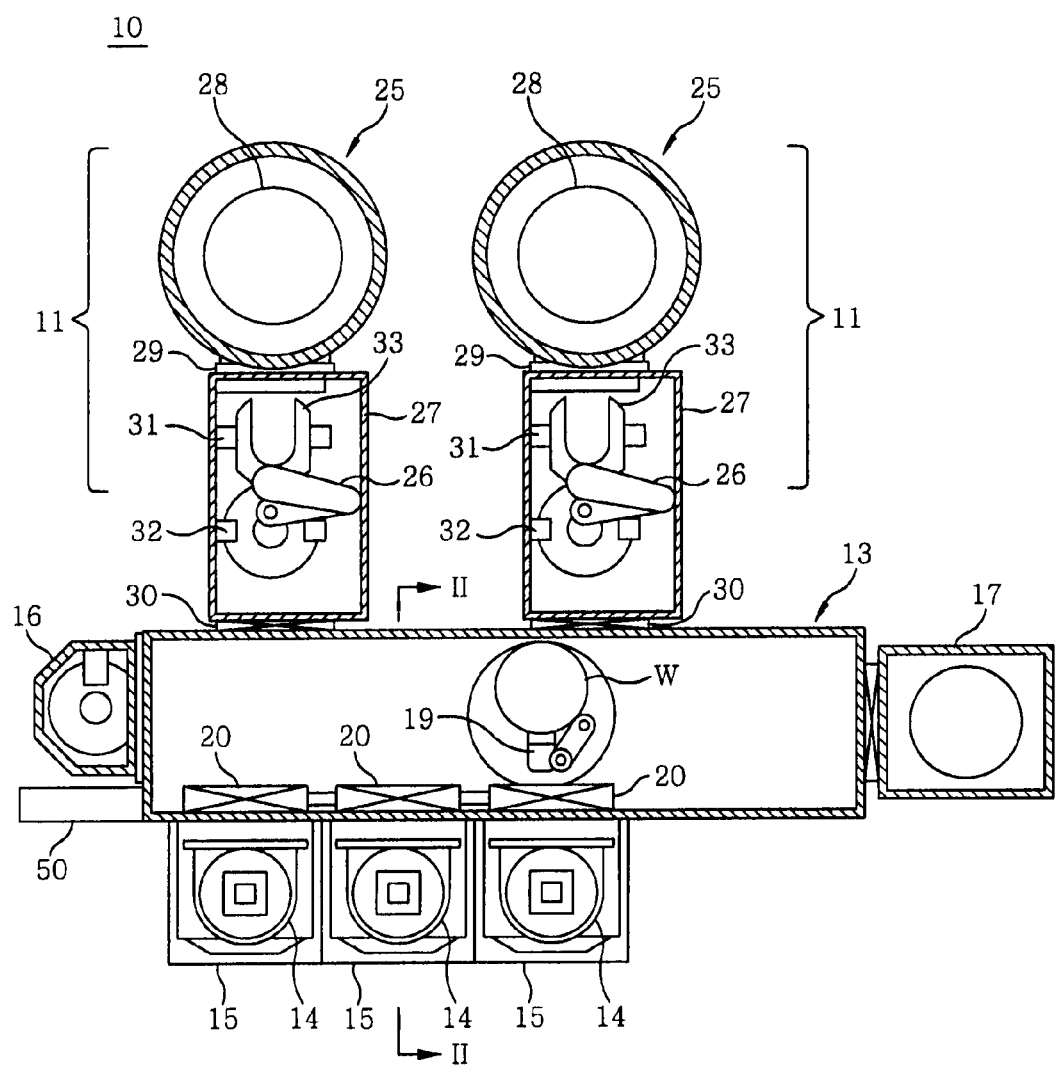
FIG. 1 is a schematic plan view showing a structure of a substrate processing apparatus including a substrate transfer device in accordance with an embodiment of the present invention.

FIG. 1 is a schematic plan view showing a structure of a substrate processing apparatus 10 including a substrate transfer device in accordance with an embodiment of the present invention As shown in FIG. 1, the substrate processing apparatus 10 includes two process ships 11 for each performing a reactive ion etching (RIE) process on a wafer W serving as a processing target substrate; and a substrate transfer device (loader module) 13 serving as a rectangular-shaped atmospheric transfer chamber connected to the two process ships 11.

Also connected to the loader module 13 in addition to the aforementioned process ships 11 are three FOUP platforms each for mounting therein a FOUP 14 serving as an accommodating vessel that accommodates, e.g., 25 sheets of wafers W; and an orienter 16 for performing a prealignment of a position of the wafer W unloaded from the FOUP 14.

The two process ships 11 are connected to a longer side of the rectangular-shaped loader module 13 and provided to opposite to the three FOUP platforms with the loader module 13 therebetween. The orienter 16 is connected to one shorter side of the loader module 13, and an after-treatment chamber 17 is connected to the other shorter side thereof.

The loader module 13 includes therein a dual SCARA (Selective Compliance Assembly Robot Arm) type transfer arm unit 19 serving as a substrate transfer unit for transferring a wafer W and has three load ports 20 serving as FOUP connecting ports for transferring wafers W therethrough, the load ports 20 being arranged at sidewalls thereof to correspond to the FOUP platforms 15, respectively. An opening/closing door is provided to each of the load ports 20. The transfer arm unit 19 is used to load and unload wafers W through the load ports 20 into and from the FOUPs 14 mounted on the FOUP platforms 15 and transfer the wafers W among the process ships 11, the orienter 16, and the after treatment chamber 17.

Each process ship 11 includes a process module 25 serving as a cylindrical processing vessel (hereinafter, referred to as "chamber") in which the wafer W is subjected to the RIE process and a load-lock module 27 having therein a link type single pick transfer arm 26 for transferring a wafer W to and from the process module 25.

The process module 25 includes an upper and a lower electrode arranged in the chamber. The distance between the upper and the lower electrode is adequately set to perform the RIE process on the wafer W. An electrostatic chuck 28 is provided at a top portion of the lower electrode to attract and hold a wafer W by a Coulomb force.

In the process module 25, a processing gas, e.g., hydrogen bromide gas or chlorine gas, is introduced into the chamber, and the introduced processing gas is converted into a plasma by generating an electric field between the upper and the lower electrode, to thereby generate ions and radicals. Then, the RIE process is performed on the wafer W by using the thus generated ions and radicals to etch, e.g., a polysilicon layer on the wafer W.

The pressure inside the loader module 13 is maintained to the atmospheric pressure, while the inside of each process module 25 is kept in vacuum. For that reason, each load-lock module 27 includes a vacuum gate valve 29 provided at a portion connected to the process module 25 and an atmospheric gate valve 30 provided at a portion connected to the loader module 13 and, thus, the load-lock module 27 serves as a vacuum antechamber capable of adjusting the pressure therein.

The transfer arm 26 is provided at a substantially central portion of each load-lock module 27. Further, inside the load-lock module 27, a first buffer 31 is provided between the process module 25 and the transfer arm 26; and a second buffer 32 is provided between the loader module 13 and the transfer arm 26. The first and the second buffer 31 and 32 are arranged above a path of a support portion (pick) 33 supporting the wafer W, the support portion 33 being provided at a leading end portion of the transfer arm 26. The first and the second buffer 31 and 32 serves to temporarily escape the wafer W having been subjected to the RIE process above the path of the support portion 33 to make the changeover smoothly between the wafer W to be subjected to the RIE process and the wafer W having been subjected thereto in the process module 25.

The substrate processing apparatus 10 further includes a system controller (not shown) for controlling the process ships 11, the loader module 13, the orienter 16, and the after-treatment chamber 17 (hereinafter, referred to as "various components); and an operation controller 21 arranged, e.g., at one end of a shorter side of the loader module 13.

The system controller controls operations of various components based on recipes serving as programs controlling the RIE process and the transfer of the wafer W. The operation controller 21 includes a state display unit having, e.g., a liquid crystal display (LCD) for displaying operation states of various components.

Figure 2:
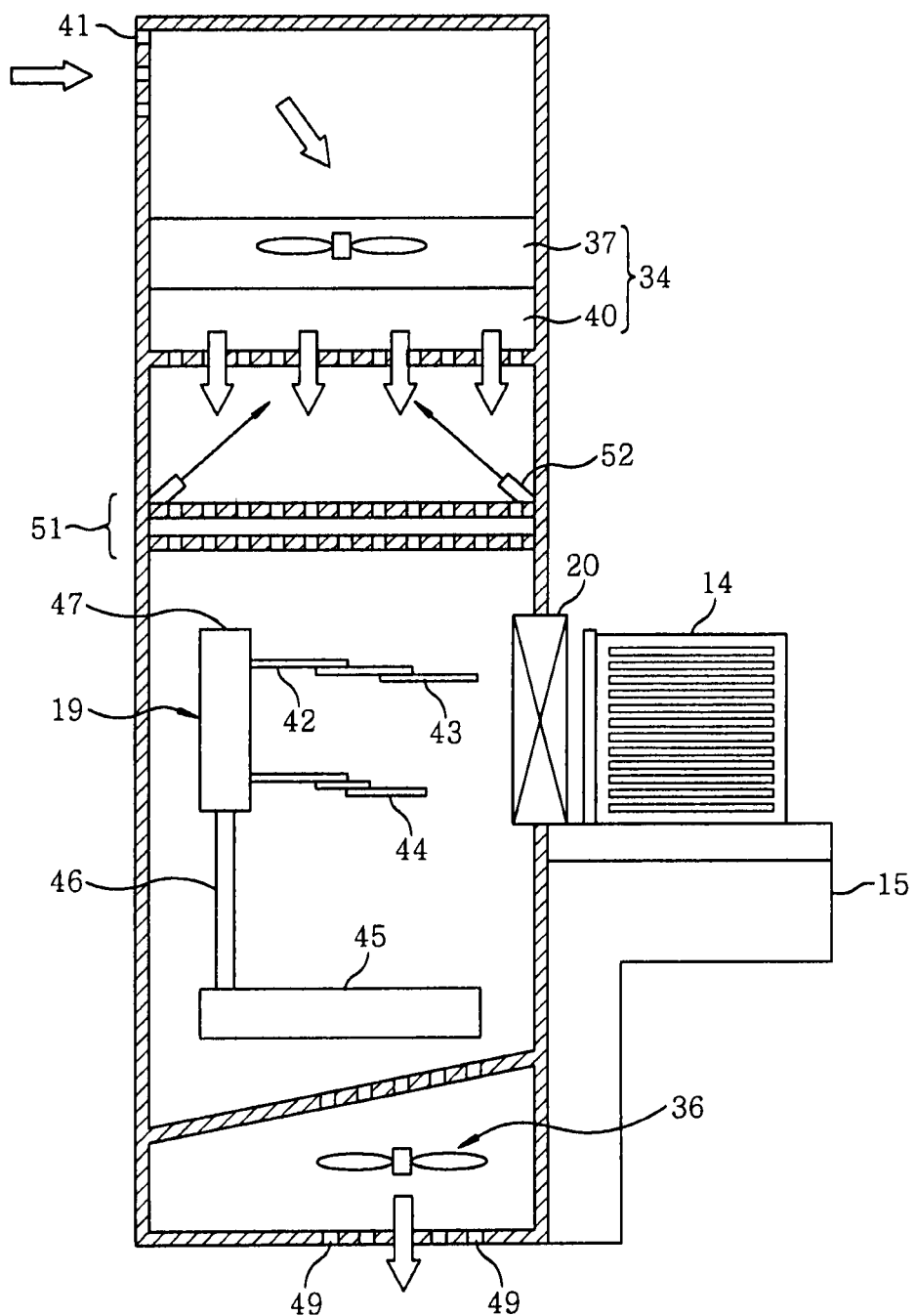
FIG. 2 is a cross sectional view schematically showing the substrate transfer device in accordance with the embodiment of the present invention, taken along a line II-II shown in FIG. 1.

FIG. 2 is a cross sectional view schematically showing the substrate transfer device in accordance with the embodiment of the present invention, taken along a line II-II shown in FIG. 1. Here, the upper and the lower side in FIG. 2 are referred to as the upper and the lower sides, respectively.

As shown in FIG. 2, the loader module 13 serving as the substrate transfer device includes an atmosphere introduction unit 41 and an atmosphere exhaust unit 49 provided at the top and the bottom, respectively, of a main body thereof; the transfer arm unit 19 provided in a substrate transfer mechanism between the atmosphere introduction unit 41 and the atmosphere exhaust unit 49; and a fan filter unit (FFU) 34 serving as a downward flow forming unit provided adjacently to the atmosphere introduction unit 41. Between the FFU 34 and the transfer arm unit 19 of the substrate transfer mechanism, a soft X-ray laser beam irradiation unit 52 and a particle collecting unit 51 are sequentially arranged in the direction in which the atmosphere downwardly flows.

The FFU 34 includes a fan unit 37 and a dust removal unit 40 which are sequentially arranged from the top of the loader module 13. The fan unit 37 includes therein a fan by which an atmosphere is downwardly blown, and the dust removal unit 40 includes therein a filter (not shown) by which dusts in the atmosphere flowing through the fan unit 37 are filtered.

Accordingly, the FFU 34 allows an atmosphere to be introduced into the loader module 13 through the atmosphere introduction unit 41 and to downwardly flow through the substrate transfer mechanism including the transfer arm unit 19 and be exhausted through the atmosphere exhaust unit 49, while collecting and removing the dusts included in the atmosphere. Therefore, the introduced atmosphere is cleaned in the loader module 13.

The transfer arm unit 19 is arranged to face the FOUP 14 mounted on the FOUP platform 15 via the load port 20. The transfer arm unit 19 includes a stretchable multi-joint transfer arm 42 and a pick 43 attached on a leading end portion of the transfer arm 42, the pick 43 being configured to mount a wafer W thereon. The transfer arm unit 19 further includes a stretchable multi-joint mapping arm 44 and a mapping sensor (not shown) attached on a leading end portion of the mapping arm 44, the mapping sensor checking whether or not the wafer W exists by generating a laser beam, for example.

Each of the base ends of the transfer arm 42 and the mapping arm 44 are connected to an elevation unit 47 that is vertically moved along an arm end column 46 standing on a base 45 of the transfer arm mechanism 19. The arm end column 46 is configured to be rotatable.

To recognize the number and position of the wafers W accommodated in the FOUP 14, a mapping operation is performed, whereby the number and position of the wafers W accommodated in the FOUP 14 is checked by stretching and vertically moving the mapping arm 44.

Since the transfer arm unit 19 is stretchable and revolvable by the transfer arm 42 and the arm end column 46, respectively, the wafer W mounted on the pick 43 thereof can freely be transferred between the FOUP 14, the process ship 11, and the orienter 16.

A duct fan 36 is arranged to face the atmosphere exhaust unit 49 having a plurality of through holes that are opened toward the bottom of the loader module 13 in order to exhaust the atmosphere thereon to an outside of the loader module through the atmosphere exhaust unit 49.

Figure 3A:
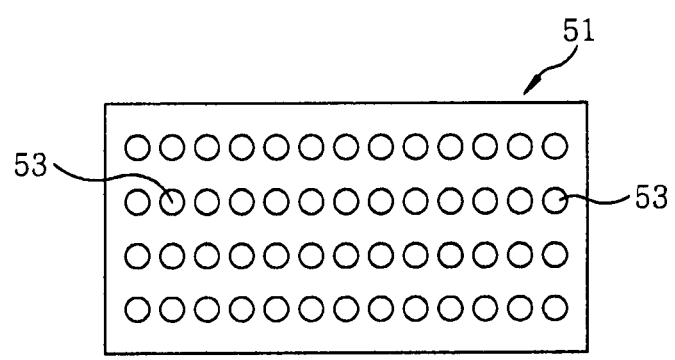
FIGS. 3A and 3B show a particle collecting unit shown in FIG. 2.
Figure 3B:
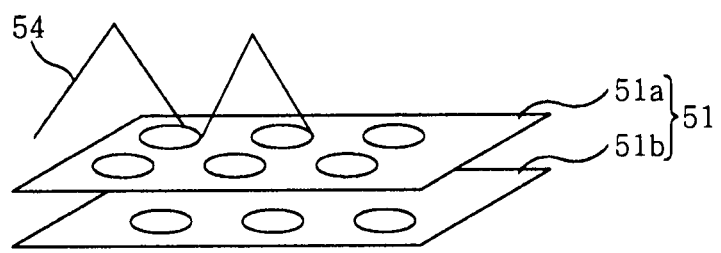

FIGS. 3A and 3b show the particle collecting unit 51 shown in FIG. 2. As shown in FIG. 3B, the particle collecting unit 51 is made by combining two rectifying plates 51a and 51b made of an electrically conductive material, e.g., stainless steel, through which a soft X-ray is not penetrated. As shown in FIG. 3A, openings 53 are provided on each of the rectifying plates 51a and 51b. Here, the openings 53 of the rectifying plate 51a are preferably arranged not to overlap with those of the rectifying plate 51b. Accordingly, it is possible to rectify the downwardly flowing atmosphere and obtain the safety by preventing a soft X-ray laser beam, irradiated from the soft X-ray laser beam irradiation unit 52 arranged at an upper portion of the particle collecting unit 51, from leaking to a lower side of the particle collecting unit 51, i.e., to the substrate transfer mechanism. Moreover, the openings 53 are needed to be provided such that the pressure loss of the downwardly flowing atmosphere is not increased.

Different bias voltages are respectively applied to the two rectifying plates 51a and 51b (or collectively referred to as "51" hereinafter) to perform a particle collecting function using electrostatic attraction.

Figure 4A:
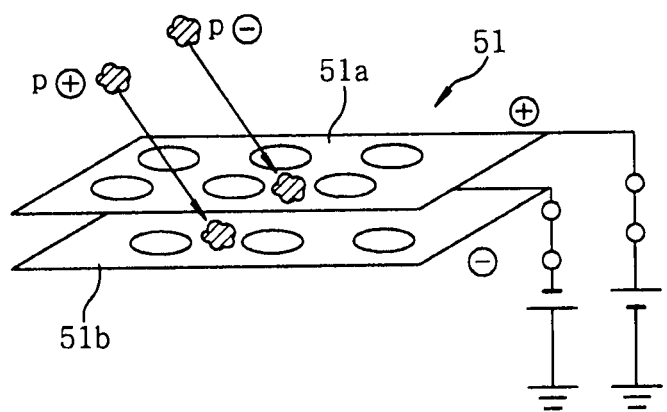
FIGS. 4A and 4B show a state of rectifying plates serving as a particle collecting unit when a bias voltage is applied thereto.
Figure 4B:
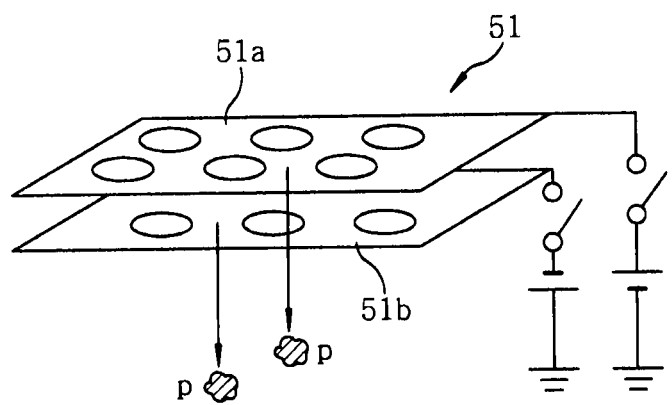
Figure 6:
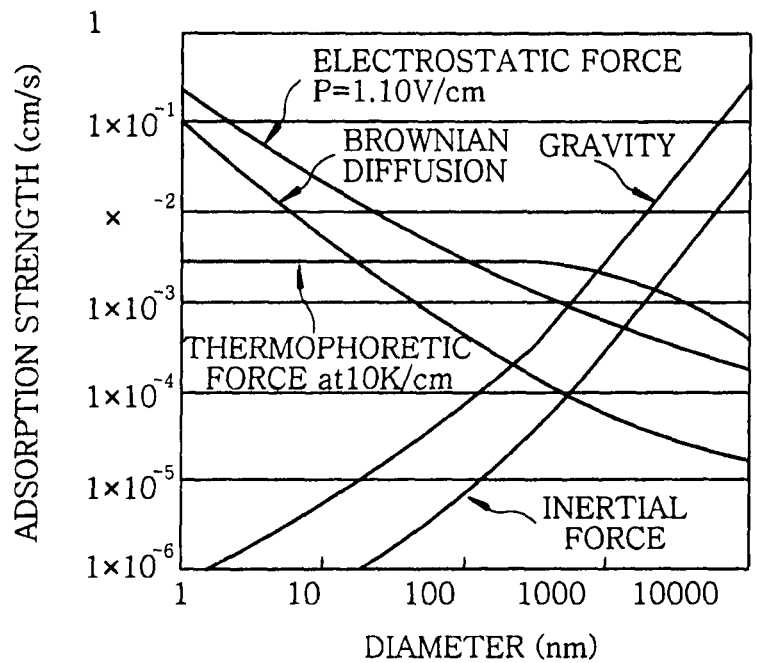
FIG. 6 is a graph showing relationships between a size of a particle and an adsorptive strength thereof.
Figure 7:
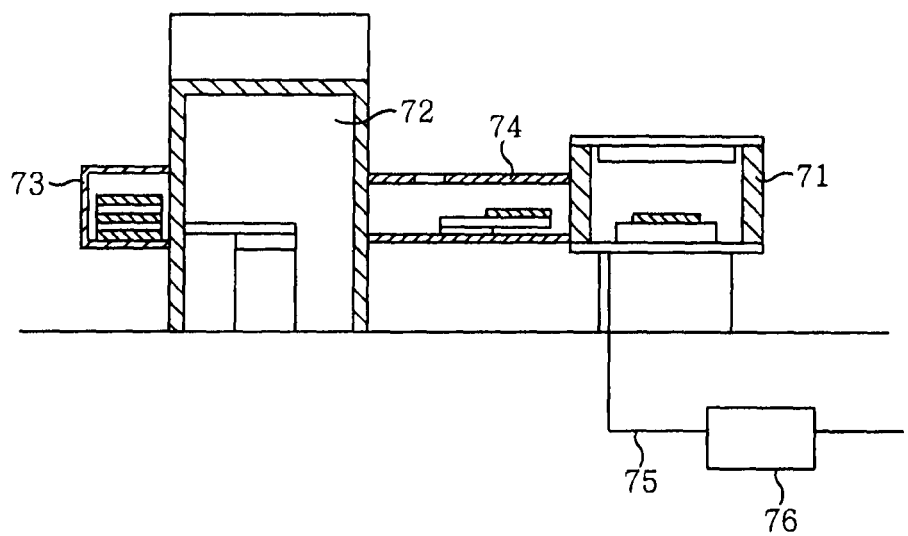
FIG. 7 shows how a prior art substrate processing apparatus is affected by static electricity.

FIGS. 4A and 4B show a state of the rectifying plates 51a and 51b serving as a particle collecting unit when a bias voltage is applied thereto.

As shown in FIG. 4A, a positive voltage of from, e.g., about 1000 V to 3000 V and a negative voltage of from, e.g., about −1000 V to −3000 V are applied to the upper and the lower rectifying plate 51a and 51b, respectively. Accordingly, negatively charged particles P are adsorbed onto the upper rectifying plate 51a, thereby being separated from the atmosphere, while positively charged particles P are adsorbed onto the lower rectifying plate 51b, thereby being separated therefrom. As a result, while a substrate is transferred, the rectifying plates 51 can function to rectify the downwardly flowing atmosphere and separate the charged particles from the atmosphere regardless of their polarity.

The particles, which have been adsorbed onto the rectifying plates 51 to be separated from the atmosphere, can be released from the rectifying plates 51 by changing the polarities of the bias voltages that have been applied to the rectifying plates 51.

Specifically, while a substrate is transferred, such adsorption of the charged particles included in the atmosphere onto the rectifying plates 51 and separation thereof from the atmosphere are carried out by applying differently polarized bias voltages to the upper and the lower rectifying plates 51, respectively, as shown in FIG. 4A. Moreover, after or during stopping of the transfer of the substrate, the adsorbed particles can be released by stopping the application of the bias voltages to the rectifying plates 51 as shown in FIG. 4B or changing the polarities of the bias voltages that have been applied thereto, thereby recovering such a filtering function of each rectifying plate 51.

Hereinafter, the substrate transfer method that is performed in the above-mentioned substrate transfer apparatus in accordance with the embodiment of the present invention will be described. Such a substrate transfer process is carried out by a system controller of the substrate transfer apparatus in accordance with a substrate transfer recipe that is a substrate transfer program.

FIG. 5 is a flow chart showing the substrate transfer process of the substrate transfer method in accordance with the embodiment of the present invention.

In FIG. 5, when the substrate transfer process is started, the suction fan of the fan unit 37 in the FFU 34 shown in FIG. 2 is activated first to introduce an atmosphere through the atmosphere introduction unit 41 into a main body of the substrate transfer apparatus 13 (step S1). Then, the atmosphere downwardly flows through the substrate transfer mechanism including the transfer arm unit 19 to be exhausted through the atmosphere exhaust unit 49 arranged on the bottom thereof (step S2). During the step S2, dusts included in the downwardly flowing atmosphere are separated therefrom and collected by the dust removal unit 40 of the FFU 34 (step S3).

Then, a soft X-ray laser beam is irradiated from the soft X-ray laser beam irradiation unit 52 to the atmosphere passing through the FFU 34, to thereby ionize the downwardly flowing atmosphere. The charged particles included in the atmosphere are charge-neutralized by the ionized atmosphere (step S4). Sequentially, the downwardly flowing atmosphere is rectified by adsorbing onto the rectifying plates 51 the charged particles remaining in the atmosphere having the charge-neutralized particles and removing the adsorbed particles therefrom (step S5).

In this way, the atmosphere that downwardly flows through the substrate transfer mechanism is cleaned, and foreign materials in the substrate transfer mechanism are discharged. Then, the opening/closing door of the load port 20 is opened, the load port 20 being arranged in front of the FOUP 14, and positions of the wafers W accommodated in the FOUP 14 are checked by using the mapping arm 44 of the transfer arm unit 19 (step S6). Sequentially, the transfer arm 42 is stretched to mount and hold a wafer w to be transferred on the pick 43 arranged at the leading end portion thereof (step S7).

After the wafer W is mounted on the pick 43 of the transfer arm unit 19, the stretchable transfer arm 42 and the rotatable arm end column 46 and the like are activated to load the wafer W mounted on the pick 43 into a destination, i.e., the load-lock module 27 of the process ship 11. Then, the process is completed (step S8).

In accordance with the present embodiment, the soft X-ray laser beam irradiation unit 52 and the rectifying plates 51 are sequentially provided, in the direction in which the atmosphere downwardly flows, between the FFU 34 serving as the downward flow forming unit 34 and the substrate transfer mechanism including the transfer arm unit 19. Accordingly, it is possible to prevent such particle contamination caused by the particles, included in the atmosphere passing through the FFU 34, being adsorbed onto the wafer W.

Specifically, the charged particles included in the atmosphere passing through the FFU 34 become electrically neutralized by the ionized gas produced by the soft X-ray laser beam irradiated from the soft X-ray laser beam irradiation unit 52. Accordingly, the charge-neutralized particles flow along with the downwardly flowing atmosphere and are exhausted to an outside of the substrate transfer device through the atmosphere exhaust unit 49. Further, positively charged particles that remain in the atmosphere passing through the FFU 34 are collected by the lower rectifying plate 51b to which a negative bias voltage is applied, while negatively charged particles that remain therein are collected by the upper rectifying plate 51a to which a positive bias voltage is applied. Accordingly, no charged particles exist in the atmosphere that downwardly flows through the substrate transfer mechanism and, thus, the wafer W can be transferred to, e.g., the process ship 11 without the adsorption of such particles thereonto.

In addition, by using the ionized gas produced by the soft X-ray laser beam irradiation unit 52, it is possible to charge-neutralize the charged particles and remove such static electricity accumulated in various elements including the wafer W in the substrate transfer device.

In the present embodiment, since the soft X-ray laser beam irradiation unit 52 is employed as the gas ionizing unit, it is possible to produce the ionized gas by ionizing the atmosphere without generation of additional particles. Further, the soft X-ray laser beam irradiation unit 52 may be turned on under consideration of its lifespan while the transfer of the substrate is stopped.

In the present embodiment, a corona discharge type ion generating unit may be employed as the gas ionizing unit instead of the soft X-ray laser beam irradiation unit 52. In this case, additional particles may be generated; however, the thus generated particles are collected and separated by the rectifying plates 51 adjacently provided downstream of the ion generating unit. As a result, there is no concern that the generated particles become a new particle contamination source.

In the present embodiment, after a substrate transfer operation is completed, it is preferable to release the particles collected by the upper and the lower rectifying plate 51a and 51b by changing the polarities of the bias voltages applied thereto during the transfer of the substrate. Accordingly, it is possible to recover the filtering function of the rectifying plates 51.

Alternatively, by stopping the application of the bias voltages to the upper and/or the lower rectifying plate 51a and/or 51b, the same effect can be obtained. The particles adsorbed onto the rectifying plate 51a and 51b are released therefrom by the gravity or the downwardly flowing atmosphere.

In the present embodiment, a transfer target substrate is not limited to a wafer for semiconductor devices. For example, the substrate may be one of various kinds of substrates, which can be used in a flat panel display (FPD) or the like including a liquid crystal display (LCD), a photomask, a CD substrate, a print substrate or the like.

The purpose of the present invention can be achieved by providing a system or an apparatus with a storage medium or the like storing program codes of software realizing the functions of the present embodiment and allowing a computer (or a central processing unit (CPU) or a microprocessor unit (MPU)) thereof to read and execute the program codes stored in the medium.

In this case, the program codes themselves read from the medium realize the functions of the aforementioned embodiment and the present invention includes the program codes and the medium storing the program codes.

The medium for providing the program codes may be, e.g., a floppy(registered trademark) disk; a hard disk; an optical disk, e.g., a magneto-optical disk, CD-ROM, CD-R, CD-RW, DVD-ROM, DVD-RAM, DVD-RW, DVD+RW or the like; a magnetic tape; a nonvolatile memory card; ROM; or the like. The program codes may also be downloaded through networks.

The functions of the aforementioned embodiment can be realized by executing the program codes read by the computer. Alternatively, an operating system (OS) or the like operating on the computer can execute a part or the whole of the actual processing in accordance with the instructions of the program codes and the functions of the embodiment can be realized by the processing executed by the OS or the like.

In addition, the program codes can be read from a storage and inputted to a memory in a built-in function extension board or an external function extension unit of a computer and the functions of the embodiment can be realized by the processing of a CPU or the like in the extension board or the extension unit, which executes the extension function thereof according to the instructions of the program codes to perform a part or the whole of the actual processing.

While the invention has been shown and described with respect to the embodiments, it will be understood by those skilled in the art that various changes and modifications may be made without departing from the scope of the invention as defined in the following claims.

What is claimed is:

1. A substrate transfer device comprising: an atmosphere introduction unit and an atmosphere exhaust unit provided at a top and a bottom portion of a main body of the device, respectively; a substrate transfer mechanism provided between the atmosphere introduction unit and the atmosphere exhaust unit; a downward flow forming unit provided, adjacent to the atmosphere introduction unit, to allow an atmosphere to be introduced through the atmosphere introduction unit and to downwardly flow through the substrate transfer mechanism and be exhausted through the atmosphere exhaust unit; and a gas ionizing unit for ionizing the atmosphere and a particle collecting unit for collecting particles included in the atmosphere, the gas ionizing unit and the particle collecting unit being sequentially provided in the direction in which the atmosphere downwardly flows, between the downward flow forming unit and the substrate transfer mechanism.

2. The device of claim 1, wherein the gas ionizing unit includes a soft X-ray laser beam irradiation unit.

3. The device of claim 1, wherein the gas ionizing unit includes a corona discharge ion generating unit.

4. The device of claim 1, wherein the particle collecting unit includes two rectifying plates to which bias voltages of different polarities are respectively applied.

5. A substrate transfer method for transferring a substrate in a substrate transfer device including an atmosphere introduction unit and an atmosphere exhaust unit provided at a top and a bottom portion of a main body of the device, respectively; a substrate transfer mechanism provided between the atmosphere introduction unit and the atmosphere exhaust unit; and a downward flow forming unit provided adjacent to the atmosphere introduction unit, the method comprising: allowing an atmosphere to be introduced through the atmosphere introduction unit and to downwardly flow through the substrate transfer mechanism and be exhausted through the atmosphere exhaust unit, by using the downward flow forming unit; and charge-neutralizing charged particles included in the atmosphere by ionizing the atmosphere by a gas ionizing unit provided between the downward flow forming unit and the substrate transfer mechanism and collecting charged particles that remain in the atmosphere by a particle collecting unit provided downstream of and adjacent to the gas ionizing unit.

6. The method of claim 5, wherein a soft X-ray laser beam irradiation unit is employed as the gas ionizing gas unit.

7. The method of claim 5, wherein a corona discharge ion generating unit is employed as the gas ionizing gas unit.

8. The method of claim 5, wherein the particle collecting unit includes two rectifying plates to which bias voltages of different polarities are respectively applied.

9. The method of claim 8, further comprising releasing particles collected by the rectifying plates therefrom by changing the polarities of the bias voltages applied to the two rectifying plates or stopping the application of the bias voltages thereto while the transfer of the substrate is stopped.

10. A substrate transfer device comprising: a main body; an atmosphere introduction unit introducing the atmosphere and an atmosphere exhaust unit exhausting the atmosphere provided at a top and a bottom portion of the main body of the device, respectively; a substrate transfer mechanism provided between the atmosphere introduction unit and the atmosphere exhaust unit; a downward flow forming unit flowing the atmosphere introduced from the atmosphere introduction unit through the substrate transfer mechanism to be exhausted through the atmosphere exhaust unit; and a gas ionizing unit for ionizing the atmosphere and a particle collecting unit for collecting particles included in the atmosphere, the gas ionizing unit and the particle collecting unit being sequentially provided in the direction in which the atmosphere downwardly flows, between the downward flow forming unit and the substrate transfer mechanism.

11. The device of claim 10, wherein the gas ionizing unit includes a soft X-ray laser beam irradiation unit.

12. The device of claim 10, wherein the gas ionizing unit includes a corona discharge ion generating unit.

13. The device of claim 10, wherein the particle collecting unit includes two rectifying plates to which bias voltages of different polarities are respectively applied.

14. A substrate transfer method for transferring a substrate in a substrate transfer device,
the substrate transfer device including a main body; an atmosphere introduction unit introducing the atmosphere and an atmosphere exhaust unit exhausting the atmosphere provided at a top and a bottom portion of a main body of the device, respectively; a substrate transfer mechanism provided between the atmosphere introduction unit and the atmosphere exhaust unit; a downward flow forming unit flowing the atmosphere introduced from the atmosphere introduction unit through the substrate transfer mechanism to be exhausted through the atmosphere exhaust unit; and a gas ionizing unit for ionizing the atmosphere and a particle collecting unit for collecting particles included in the atmosphere, the gas ionizing unit and the particle collecting unit being sequentially provided in the direction in which the atmosphere downwardly flows, between the downward flow forming unit and the substrate transfer mechanism, the method comprising:

allowing the atmosphere to be introduced through the atmosphere introduction unit;

passing the atmosphere through the downward flow forming unit to charge particles included in the atmosphere;

flowing downwardly the atmosphere passed through the downward flow forming unit through the substrate transfer mechanism to be exhausted through the atmosphere exhaust unit;

ionizing the atmosphere to form an ionized gas by the gas ionizing unit;

charge-neutralizing the charged particles with the ionized gas; and collecting the charge-neutralized particles by the particle collecting unit.

15. The method of claim 14, wherein a soft X-ray laser beam irradiation unit is employed as the gas ionizing gas unit.

16. The method of claim 14, wherein a corona discharge ion generating unit is employed as the gas ionizing gas unit.

17. The method of claim 14, wherein the particle collecting unit includes two rectifying plates to which bias voltages of different polarities are respectively applied.

18. The method of claim 17, further comprising releasing particles collected by the rectifying plates therefrom by changing the polarities of the bias voltages applied to the two rectifying plates or stopping the application of the bias voltages thereto while the transfer of the substrate is stopped.

* * * * *